(12) United States Patent
Tourret

(10) Patent No.: US 8,350,597 B2
(45) Date of Patent: Jan. 8, 2013

(54) LOW VOLTAGE SELF CALIBRATED CMOS PEAK DETECTOR

(75) Inventor: Jean-Robert Tourret, Cormelles le Royal (FR)

(73) Assignee: NXP B.V., Eindhoven (NL)

( * ) Notice: Subject to any disclaimer, the term of this patent is extended or adjusted under 35 U.S.C. 154(b) by 87 days.

(21) Appl. No.: 13/123,844

(22) PCT Filed: Oct. 7, 2009

(86) PCT No.: PCT/IB2009/054389
§ 371 (c)(1),
(2), (4) Date: Apr. 12, 2011

(87) PCT Pub. No.: WO2010/044012
PCT Pub. Date: Apr. 22, 2010

(65) Prior Publication Data
US 2011/0241732 A1    Oct. 6, 2011

(30) Foreign Application Priority Data
Oct. 15, 2008   (EP) .................................... 08290964

(51) Int. Cl.
*H03K 5/153* (2006.01)
(52) U.S. Cl. ......................................... 327/58; 327/307
(58) Field of Classification Search ............... 327/58–62, 327/307
See application file for complete search history.

(56) References Cited

U.S. PATENT DOCUMENTS

| | | | |
|---|---|---|---|
| 5,331,210 A | 7/1994 | McCarroll | |
| 5,880,615 A | 3/1999 | Bazes | |
| 6,031,420 A | 2/2000 | Vander Voorde | |
| 6,087,897 A | 7/2000 | Wang | |
| 6,429,697 B1 | 8/2002 | Amazeen et al. | |
| 6,512,399 B1 | 1/2003 | DeGeronimo et al. | |
| 6,762,643 B2 * | 7/2004 | Milanesi | 330/9 |
| 7,142,042 B1 * | 11/2006 | Henry | 327/538 |
| 7,750,611 B2 * | 7/2010 | Lee | 323/274 |
| 2006/0255860 A1 | 11/2006 | Moussavi | |
| 2007/0126480 A1 | 6/2007 | McQuirk et al. | |

OTHER PUBLICATIONS

International Search Report and Written Opinion for International Patent Appln. No. PCT/IB2009/054389 (Mar. 1, 2010).

\* cited by examiner

*Primary Examiner* — Quan Tra

(57) ABSTRACT

The present invention relates to a low-voltage self-calibrated peak detector (100). Using a two-step calibration process that compensates the offset errors introduced by the respective first, second and third comparators (122, 128, 130), the peak detection is made accurate whatever temperature, process or mismatch spreads. Its input bandwidth can be as high as the bandwidth of an operational amplifier of unity gain. In a rail-to-rail configuration, it can be implemented into a fully differential low-voltage self-calibrated CMOS peak detector (200), which can have a very high conversion gain (α) and a very high input signal dynamic ranging.

15 Claims, 3 Drawing Sheets

LOW VOLTAGE SELF CALIBRATED CMOS PEAK DETECTOR

FIELD OF THE INVENTION

The present invention relates to the field of peak detection circuits, and more particularly to a low-voltage self-calibrated CMOS peak detector.

BACKGROUND OF THE INVENTION

A common circuit found in signal processing applications is a peak detector. The function of a peak detector is to receive a time-varying input signal, such as a sinusoidal signal, a data pulse, etc., and detect and hold an output signal that is a DC signal proportional to the maximum or minimum value of the input signal.

Referring to FIG. 1, a conventional peak detector circuit 10 comprises an analog comparator 12 for comparing an input voltage Vi with a voltage Vh stored on a capacitor 14 that is coupled to an output terminal OUT of the peak detector circuit 10.

In the case of a positive peak detector, the input voltage Vi of an input signal IN is supplied to the non-inverting input terminal (+) of the comparator 12, whereas the capacitor voltage Vh is supplied to the inverting input terminal (−) of the comparator 12.

When the input voltage Vi exceeds the capacitor voltage Vh, the output of the comparator 12 transitions high, and turns ON a switching element 16 connected between a supply voltage Vdd and the capacitor 14, thereby coupling the supply voltage Vdd to the capacitor 14. As a result, the capacitor 14 can be charged by the current that flows through the switching element 16, and the capacitor voltage Vh can thus increase. When Vh reaches the positive peak value Vimax of the input voltage Vi, the output of the comparator 12 transitions low, and turns OFF the switching element 16, thereby decoupling the supply voltage Vdd from the capacitor 14. The capacitor 14 then ceases being charged and memorizes the capacitor voltage Vh at the positive peak value Vimax.

However, due to component mismatches, each comparator owns a unique inherent offset voltage Voff, namely the only voltage appearing at its input when the input terminals (+) and (−) are short-circuited. The output voltage Vout of the peak detector circuit 10 at the output terminal OUT will be thus affected by an error corresponding to the offset voltage Voff of the comparator 12, which is given by equation (1) as follows:

$$Vout = Vimax + Voff$$

Thus, the accuracy of the peak detector circuit 10 suffers from the offset voltage Voff. As its magnitude is unique for each peak detector due to unique component mismatches, the offset voltage effects are not predictable and therefore difficult to compensate.

Peak detectors are widely used in integrated circuits, and in particular in Radio Frequency (RF) transceivers when they are tested using the Built-In Self-Test (BIST) technique or affected by the detection of unwanted high level bursts either in RF or Intermediate Frequency (IF). In such peak detectors, the conversion gain a between the output voltage Vout and the maximum amplitude Vimax of the input signal IN is an important parameter that is desired to be so high and accurate as possible. However, the accuracy of such peak detectors suffers not only from the offset voltage Voff, magnitude and polarity of which are unknown, but also from temperature, process or mismatch spreads.

SUMMARY OF THE INVENTION

It is therefore an object of the present invention to provide, in a rail-to-rail configuration, a low-voltage self-calibrated CMOS peak detector circuit exhibiting a very high conversion gain and input signal dynamic.

This object is achieved by a circuit arrangement as claimed in claim 1, a system as claimed in claim 9, a method as claimed in claim 10, a computer program as claimed in claim 14, and an integrated circuit as claimed in claim 15.

In accordance with the present invention, there is provided a circuit arrangement comprising:

a first comparator with a first input terminal and a second input terminal, the first comparator having a first input offset voltage when the first and second input terminals are short-circuited;

a second comparator with a third input terminal and a fourth input terminal, the second comparator having a second input offset voltage when the third and fourth input terminals are short-circuited;

a third comparator with a fifth input terminal and a sixth input terminal, the third comparator having a third input offset voltage when the fifth and sixth input terminals are short-circuited;

wherein, the third comparator is configured in a first phase to compensate the first and second input offset voltages and minimize the offset errors generated by the third input offset voltage; and the second comparator is configured in a second phase to compensate the first input offset voltage based on the first phase, the second phase being subsequent to the first phase;

each one of the first, second and third comparators has its output coupled together to a high impedance node.

During the first phase:

the first comparator is configured to operate in open-loop fashion and has the first and second input terminals short-circuited and supplied by a reference voltage;

the second comparator is configured to operate in open-loop fashion and has the third and fourth input terminals short-circuited and supplied by the reference voltage;

the third comparator is configured to operate in closed-loop fashion and compare the fifth input terminal supplied by the reference voltage to the sixth input terminal coupled to the high impedance node.

Additionally, the comparison result of the third comparator can be stored in a first memory element when a first voltage value of the sixth input terminal reaches the reference voltage of the fifth input terminal.

During the second phase:

the first comparator is configured to operate in open-loop fashion and has the first and second input terminals short-circuited and supplied by the reference voltage;

the second comparator is configured to operate in closed-loop fashion and compare the fourth input terminal supplied by the reference voltage to the input terminal supplied by a supply voltage through a switching element;

the third comparator is configured to operate in open-loop fashion and compare the fifth input terminal supplied by the reference voltage to the sixth input terminal supplied by the first voltage value.

Additionally, the comparison result of the second comparator is stored in a second memory element when a second voltage value of the fourth input terminal reaches the reference voltage of the third input terminal.

During a third phase:

the first comparator is configured to operate in open-loop fashion and compare the first input terminal supplied by the reference voltage to the second input terminal supplied by an output voltage of the circuit arrangement, the output voltage being equal or close to the second voltage value;

the second comparator is configured to operate in open-loop fashion and compare the fourth input terminal supplied by the reference voltage to the input terminal supplied by the second voltage value;

the third comparator is configured to operate in open-loop fashion and compare the fifth input terminal supplied by the reference voltage to the sixth input terminal supplied by the first voltage value.

Furthermore, the switching element may be a gate-controlled switching device driven by the high impedance node.

Moreover, the first input terminal may be further supplied by a time-varying input voltage.

In accordance with the present invention, there is provided a system comprising the circuit arrangement, which may be implemented such that the system be a fully differential system in a rail-to-rail configuration.

In accordance with the present invention, there is also provided a method of calibrating the circuit arrangement, the method comprising the steps of:

compensating the first and second input offset voltages during the first phase;

minimizing the offset errors generated by the third input offset voltage during the first phase; and compensating the first input offset voltage during the second phase based on the first phase, the second phase being subsequent to the first phase.

Furthermore, the method during the first phase comprises the steps of:

operating in open-loop fashion for the first and second comparators;

supplying the first and second input terminals of the first comparator and the third and fourth input terminals of the second comparator with the reference voltage;

operating in closed-loop fashion for the third comparator;

comparing the fifth input terminal supplied by the reference voltage to the sixth input terminal coupled to the high impedance node; and storing the comparison result of the third comparator in the first memory element when the first voltage value of the sixth input terminal reaches the reference voltage of the fifth input terminal.

Furthermore, the method during the second phase comprises the steps of:

operating in open-loop fashion for the first and third comparators;

supplying the first and second input terminals of the first comparator with the reference voltage;

operating in closed-loop fashion for the second comparator;

comparing the fourth input terminal supplied by the reference voltage to the input terminal supplied by the supply voltage through the switching element;

comparing the fifth input terminal supplied by the reference voltage to the sixth input terminal supplied by the first voltage value; and storing the comparison result of the second comparator in the second memory element when the second voltage value of the fourth input terminal reaches the reference voltage of the third input terminal.

Furthermore, the method during the third phase comprises the steps of:

operating in open-loop fashion for the first, second and third comparators;

comparing the first input terminal supplied by the reference voltage to the second input terminal supplied by the output voltage of the circuit arrangement, the output voltage being equal or close to the second voltage value;

comparing the fourth input terminal supplied by the reference voltage to the input terminal supplied by the second voltage value;

comparing the fifth input terminal supplied by the reference voltage to the sixth input terminal supplied by the first voltage value.

The steps of the previous method can be carried out by a computer program comprising program code means when the computer program is carried out on a computer.

The present invention further extends to an integrated circuit comprising the preceding system.

BRIEF DESCRIPTION OF THE DRAWINGS

These and other aspects and advantages of the present invention will be apparent from and elucidated with reference to the embodiment(s) described hereinafter. In the following drawings.

DETAILED DESCRIPTION OF EMBODIMENTS

Figure 1:
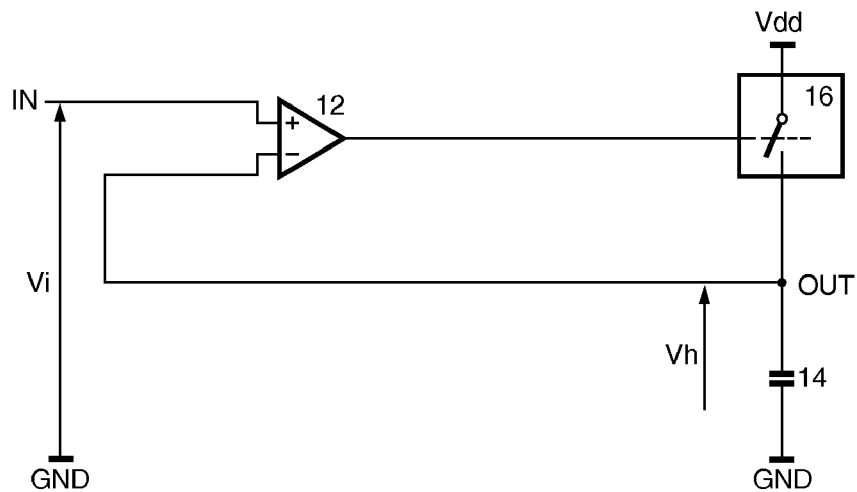
FIG. 1 shows a block diagram of a conventional peak detector circuit.
Figure 2:
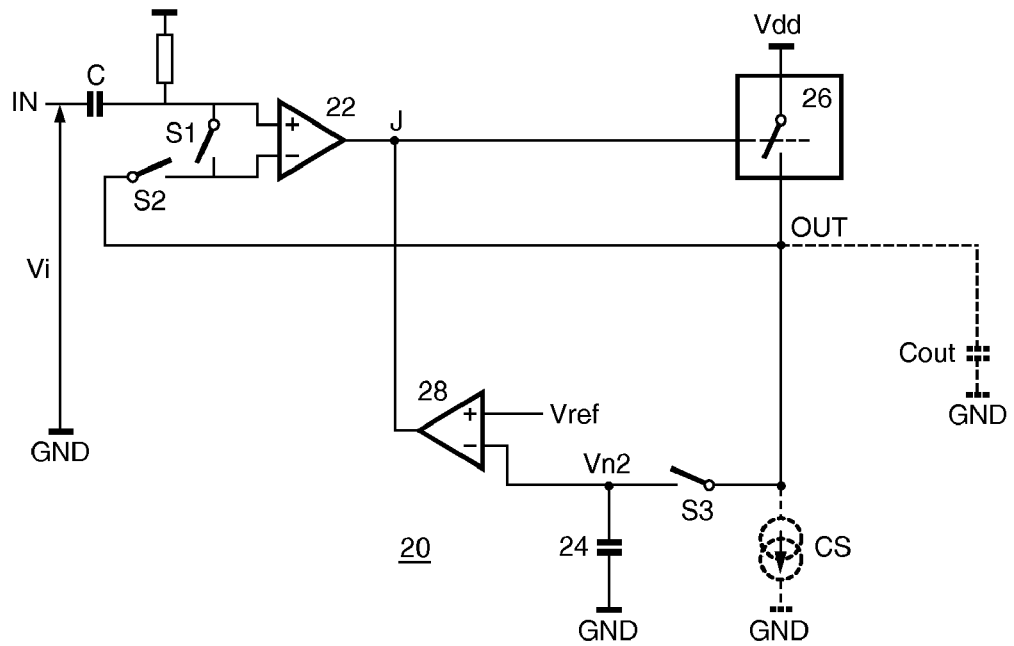
FIG. 2 shows a block diagram of a low-voltage self-calibrated peak detector circuit in the case of a one-step calibration.

The peak detector 30 according to an embodiment of the present invention will be derived from the teachings of the peak detector 20 of FIG. 2.

FIG. 2 depicts a low-voltage self-calibrated peak detector circuit 20 in the case of a one-step calibration, which is configured to eliminate the offset voltage Voff of a first comparator 22, e.g. an operational amplifier.

Besides the first comparator 22, such a peak detector circuit 20 further comprises a second comparator 28, e.g. an operational amplifier, a memory element 24, e.g. a capacitor, a switching element 26, e.g. a PMOS transistor or any other gate-controlled switching device, a respective first and third switch S1, S3 respectively controlled by means of a same clock signal Φ1, and a second switch S2 controlled by means of a clock signal Φ2 that is the clock signal Φ1 but inverted. Thus, the first and third switches S1, S3 are closed when the second switch S2 is open and vice versa.

The non-inverting input terminal (+) of the first comparator 22 is coupled to a DC reference voltage Vref and through a DC filter capacitor C to a time-varying input voltage Vi of an input signal IN. The series terminals of the first switch S1 are respectively coupled to the non-inverting input terminal (+) and the inverting input terminal (−) of the first comparator 22. The series terminals of the third switch S3 are respectively coupled to an output terminal OUT of the peak detector circuit 20 and the inverting input terminal (−) of the second comparator 28 to which the memory element 24 is also coupled. The series terminals of the second switch S2 are respectively coupled to the inverting input terminal (−) of the first comparator 22 and the output terminal OUT. The non-inverting input terminal (+) of the second comparator 28 is supplied by the DC reference voltage Vref. The voltage Vj at the junction point J is the sum of the output voltage delivered by the first and second comparators 22, 28.

In the following, it will be assumed that the input voltage Vi has a zero amplitude, such that the non-inverting input terminal (+) of the first comparator 22 is only supplied by the DC reference voltage Vref.

During a first clock phase (I), also called the offset compensation phase or calibration phase, the first and third switches S1, S3 are closed, whereas the second switch S2 is open such that the first comparator 22 operates in open-loop fashion. By closing the first switch S1, the two input terminals (+) and (−) of the first comparator 22 are short-circuited and supplied by the DC reference voltage Vref, and the only input voltage across both input terminals (+) and (−) will be the inherent input offset voltage Voff1 of the first comparator 22. By closing the third switch S3, the output voltage Vout at the output terminal OUT will be compared to the DC reference voltage Vref through the second comparator 28. The output voltage Vout being initially lower than the DC reference voltage Vref, the output of the second comparator 28 will transition high, such that the voltage Vj at the junction point J will be sufficiently high to turn ON the switching element 26 connected between a supply voltage Vdd and the memory element 24, thereby coupling the supply voltage Vdd to the memory element 24. As a result, the memory element 24 can be charged by the current that flows through the switching element 26, and the output voltage Vout can thus increase for compensating the additional voltage induced at the junction point J by the input offset voltage Voff1 of the first comparator 22. The switching element 26 will be chosen in such a manner that when Vout reaches Vref, the voltage Vj at the junction point J is sufficiently low to turn OFF the switching element 26, thereby decoupling the supply voltage Vdd from the memory element 24. The memory element 24 then ceases being charged and memorizes the voltage Vref, which is the voltage Vn2 corresponding to the additional biasing needed to compensate the input offset voltage Voff1 of the first comparator 22 that appears when its both input terminals (+) and (−) are short-circuited and supplied by the same DC reference voltage Vref.

During a second clock phase (II), also called the normal mode, the first and third switches S1, S3 are open, whereas the second switch S2 is closed such that the first comparator 22 operates in closed-loop fashion. The voltage Vref corresponding to the additional biasing needed to compensate the input offset voltage Voff1 of the first comparator 22 is not only memorized or stored in the memory element 24 but also in another memory element Cout coupled to the output terminal OUT, such that, by closing the second switch S2, the inverting input terminal (−) of the first comparator 22 is supplied by the same voltage Vref as its non-inverting input terminal (+) when the amplitude of the input signal Vi is zero. Indeed, the voltage Vout across the memory element Cout can slightly fluctuate, i.e. decrease when the switching element 26 is a PMOS transistor or increase when it is a NMOS transistor, due to small constant current sources or constant charge pumps CS across the memory element Cout.

Moreover, it is to be noted that the voltage Vn2 after the first calibration phase (I) is valid just after the calibrations is made, as it may decrease or increase depending on the leakage current of the memory element 24.

Although the closed-loop gain of the peak detector circuit 20 is unity or close to unity with Vout≈Vref, the input offset voltage Voff2 of the second comparator 28 cannot be reduced within the open-loop gain of the first comparator 22, such that the offset errors introduced by the first comparator 22 and compensated by the configuration of the peak detector circuit 20 are replaced by the offset errors introduced by the second comparator 28.

Figure 3:
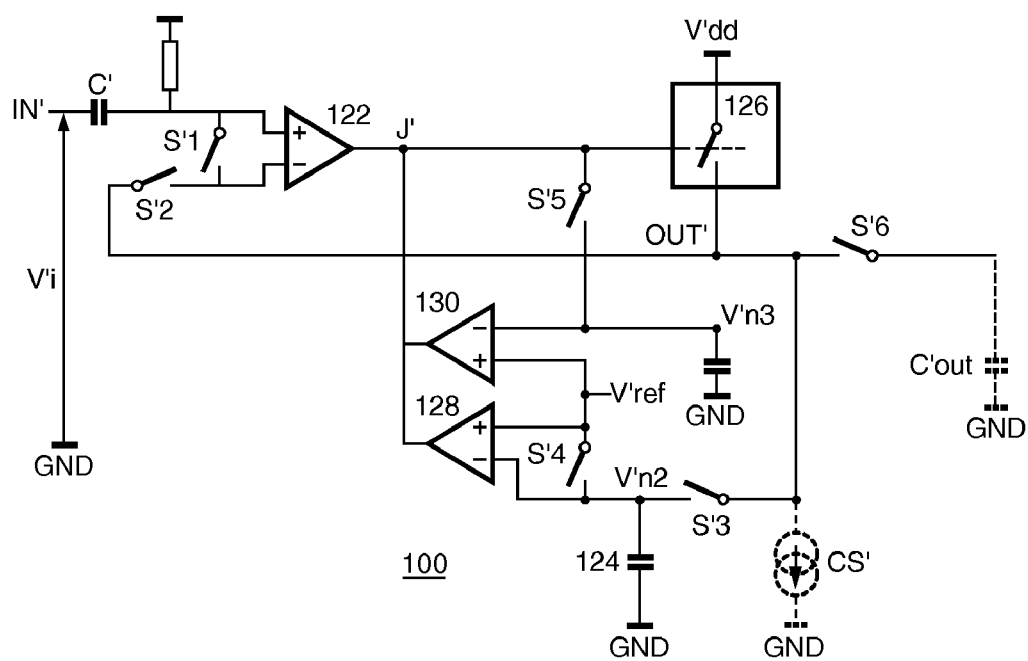
FIG. 3 shows a block diagram of a low-voltage self-calibrated peak detector circuit in the case of a two-step calibration according to an embodiment of the present invention.

In order to improve the accuracy of the conversion gain of the peak detector circuit 100 of FIG. 2, the second comparator 28 also needs to be calibrated for cancelling its input offset voltage Voff2. To do so, the loop gain during this calibration needs to be high. The summation point at the junction point J is a high impedance node where the outputs of all the comparators will be connected, the gain from the output voltage of whichever comparator to the voltage Vj at the junction point J is high, i.e. greater than 40 dB. Based on these remarks, FIG. 3 discloses a low-voltage self-calibrated peak detector circuit 100 in the case of a two-step calibration according to an embodiment of the present invention.

Such a peak detector circuit 100 comprises a respective first, second and third comparator 122, 128, 130, e.g. an operational amplifier, a respective first and second memory element 124, 132, e.g. a capacitor, a switching element 126, e.g. a PMOS transistor or any other gate-controlled switching device, a respective first, second, third, fourth, fifth and sixth switch S'1-S'6.

The first switch S'1 is alternatively controlled by means of a clock signal Φ'1 and a clock signal Φ'2. The fourth and fifth switches S'4-S'5 are controlled by means of a same clock signal Φ'1. The third switch S'3 is controlled by means of a clock signal Φ'2. The second and sixth switches S2, S6 are controlled by means of a clock signal Φ'3 that is the sum of the clock signals Φ'1 and Φ'2 but inverted. Thus, the first, fourth and fifth switches S'1, S'4, S'5 are closed through the clock signal Φ'1 as well as the first and third switches S'1, S'3 through the clock signal Φ'2 when the second and sixth switches S'2, S'6 are open and vice versa.

The non-inverting input terminal (+) of the first comparator 122 is coupled to a DC reference voltage V'ref and through a DC filter capacitor C' to a time-varying input voltage V'i of an input signal IN'. The series terminals of the first switch S'1 are respectively coupled to the non-inverting input terminal (+) and the inverting input terminal (−) of the first comparator 122. The series terminals of the third switch S'3 are respectively coupled to an output terminal OUT' of the peak detector circuit 100 and the inverting input terminal (−) of the second comparator 128 to which the first memory element 124 is also coupled. The series terminals of the second switch S'2 are respectively coupled to the inverting input terminal (−) of the first comparator 122 and the output terminal OUT'. The non-inverting input terminal (+) of the second and third comparators 128, 130 is supplied by the same DC reference voltage V'ref. The series terminals of the fourth switch S'4 are respectively coupled to the non-inverting input terminal (+) and the inverting input terminal (−) of the second comparator 128. The series terminals of the fifth switch S'5 are respectively coupled to the output of the first comparator 122 and the inverting input terminal (−) of the third comparator 130. Thus, the voltage V'j at the junction point J' is the sum of the output voltage delivered by the first, second and third comparators 122, 128, 130.

In the following, it will be assumed that the input voltage V'i has a zero amplitude, such that the non-inverting input terminal (+) of the first comparator 122 is only supplied by the DC reference voltage V'ref.

During a first clock phase (I'), also called the first offset compensation phase or first calibration phase, the first, fourth and fifth switches S'1, S'4, S'5 are closed, whereas the second, third and sixth switches S'2, S'3, S'6 are open such that the first and second comparators 122, 128 operate in open-loop fashion. By closing the first and fourth switches S'1, S'4, the two input terminals (+) and (−) of the first and second comparators 122, 128 are short-circuited and supplied by the same DC reference voltage V'ref, and the only input voltage across both input terminals (+) and (−) will be their respective inherent input offset voltage, namely V'off1 for the first comparator 122 and V'off2 of the second comparator 128. By closing the fifth switch S'5, the voltage V'j at the junction point J' will be compared to the DC reference voltage V'ref through the third comparator 130. The voltage V'j being initially lower than the DC reference voltage V'ref, the voltage V'j will increase for compensating the additional voltage induced at the junction point J' by the input offset voltages V'off1 and V'off2 until reaching the DC reference voltage V'ref. The validity of this operation is due to the fact that the gain from V'j to the output voltage V'out at the output terminal OUT' is about 40 dB (PMOS active load). Thus, the offset errors introduced by the third comparator 130 will be made negligible while being divided by a factor of about 100 (i.e. 40 dB). Upon reaching V'ref, the second memory element 132 then ceases being charged and memorizes the voltage V'ref, which is the voltage V'n3 corresponding to the additional biasing needed to compensate the input offset voltages V'off1 of the first comparator 122 and V'off2 of the second comparator 128 that appear when their respective input terminals (+) and (−) are short-circuited and supplied by the same DC reference voltage V'ref.

While maintaining active the compensation by the third comparator 130 thanks to the second memory element 132, the calibration process continues with a second clock phase (II'), also called the second offset compensation phase or second calibration phase. The process of that phase (II') is identical to that of the phase (I) of FIG. 2. Thus, the first and third switches S'1, S'3 are closed, whereas the second, fourth, fifth and sixth switches S'2, S'4, S'5, S'6 are open such that only the first comparator 122 operates in open-loop fashion. By closing the first switch S'1, the two input terminals (+) and (−) of the first comparator 122 are short-circuited and supplied by the DC reference voltage V'ref, and the only input voltage across both input terminals (+) and (−) will be the inherent input offset voltage V'off1 of the first comparator 122. By closing the third switch S'3, the output voltage V'out at the output terminal OUT' will be compared to the DC reference voltage V'ref through the second comparator 128. The output voltage V'out being initially lower than the DC reference voltage V'ref, the output of the second comparator 128 will transition high, such that the voltage V'j at the junction point J' will be sufficiently high to turn ON the switching element 126 connected between a supply voltage V'dd and the first memory element 124, thereby coupling the supply voltage V'dd to the first memory element 124. As a result, the first memory element 124 can be charged by the current that flows through the switching element 126, and the output voltage V'out can thus increase for compensating the additional voltage induced at the junction point J' by the input offset voltage V'off1 of the first comparator 122, the input offset voltage V'off3 of the third comparator 130 being negligible as explained above. The switching element 126 will be chosen in such a manner that when V'out reaches V'ref, the voltage V'j at the junction point J' is sufficiently low to turn OFF the switching element 126, thereby decoupling the supply voltage V'dd from the first memory element 124. The first memory element 124 then ceases being charged and memorizes the voltage V'ref, which is the voltage V'n2 corresponding to the additional biasing needed to compensate the input offset voltage V'off1 of the first comparator 122 that appears when its both input terminals (+) and (−) are short-circuited and supplied by the same DC reference voltage V'ref.

During a third clock phase (III), also called the normal mode, the first, third, fourth and fifth switches S'1, S'3-S'5 are open, whereas the second and sixth switches S'2, S'6 are closed such that the first comparator 122 operates in closed-loop fashion. The voltage V'ref corresponding to the additional biasing needed to compensate the input offset voltage V'off1 of the first comparator 122 is not only memorized or stored in the first memory element 124 but also in another memory element C' out coupled to the output terminal OUT' through the sixth switch S'6, such that, by closing the second and sixth switches S'2, S'6, the inverting input terminal (−) of the first comparator 122 is supplied by the same voltage V'ref as its non-inverting input terminal (+) when the amplitude of the input signal V'i is zero. Indeed, the voltage V'out across the memory element C'out can slightly fluctuate, i.e. decrease when the switching element 126 is a PMOS transistor or increase when it is a NMOS transistor, due to small constant current sources or constant charge pumps CS' across the memory element C' out.

It is to be noted that the voltage V'n2 after the first calibration phase (I') and the voltage V'n3 after the second calibration phase (II') are valid just after both calibrations are made, as they may decrease or increase depending on the leakage current of the respective first and second memory elements 124, 132.

It is also to be noted that in the case that the switching element 126 is a PMOS/NMOS transistor, it is known that its gate-source voltage Vgs can change with respect to the supply voltage Vdd, temperature and process spreads, and the total input referred offset after the two calibration steps (phases I' and II') can be as high as the ratio between (Vdd-V'ref) and the gain (40 dB) of the first comparator 122. However, it can be numerically seen that if the total Vgs variation is assumed to be about 100 mV (i.e. 1 sigma), so the total input referred offset after the two calibration steps is low and equal to about 100 mV/100=1 mV. Thus, the two-step calibration process stays accurate whatever temperature, process or mismatch spreads.

Figure 4:
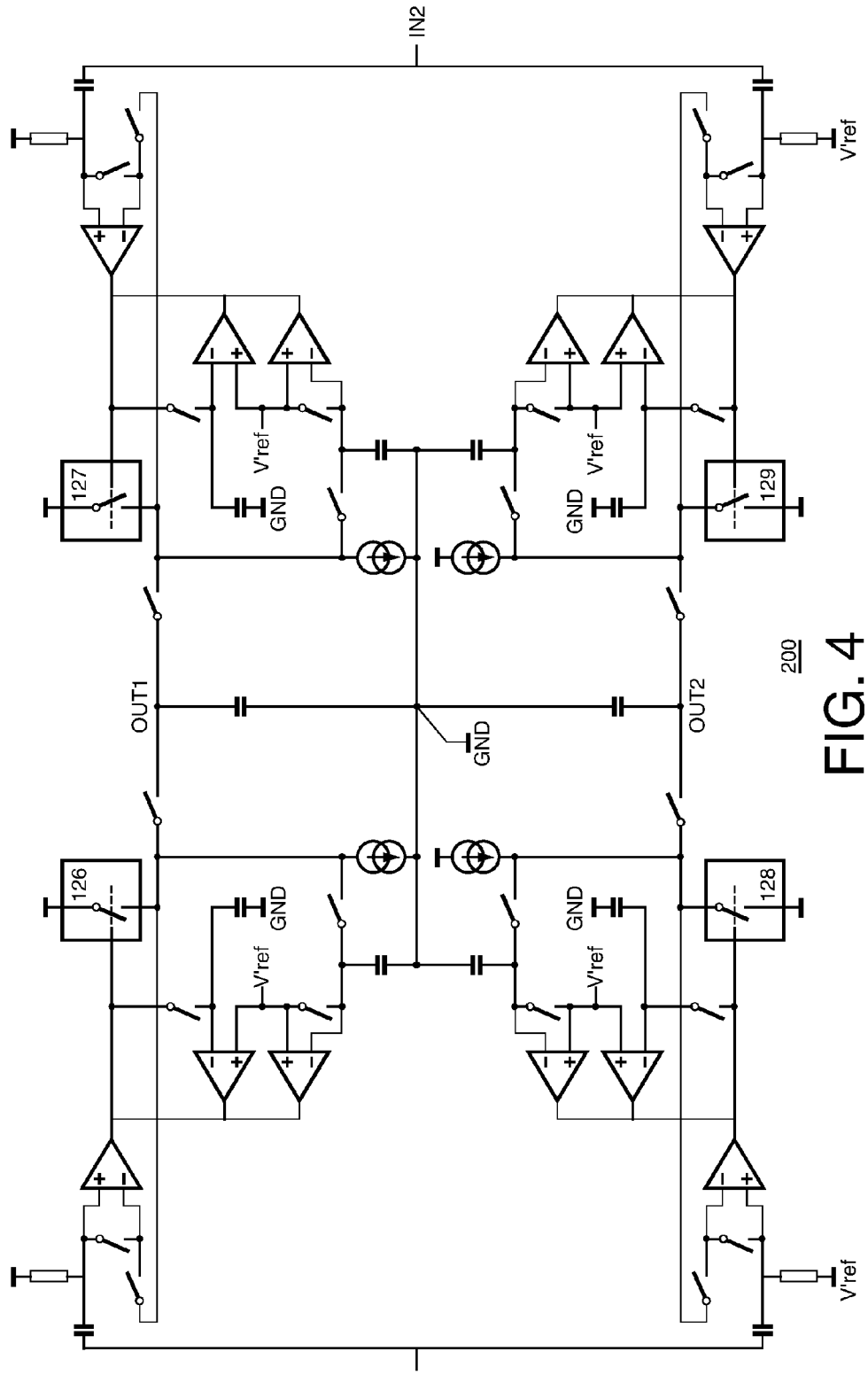
FIG. 4 shows a block diagram of a fully differential low-voltage self-calibrated CMOS peak detector circuit according to an embodiment of the present invention.

Based on the peak detector circuit 100 of FIG. 2, FIG. 4 shows a fully differential low-voltage self-calibrated CMOS peak detector circuit 200 according to an embodiment of the present invention, wherein the switching elements 126 and 127 are of a same type, e.g. p-type MOSFET, and the switching elements 128 and 129 are also of a same type but inverted, e.g. n-type MOSFET, with respect to that of the switching elements 126 and 127. Such a peak detector circuit 200 is configured to provide two DC output voltages at the respective output terminals OUT1 and OUT2, each one corresponding to a full-wave rectified detection of the time-varying input signals IN1 and IN2 of opposite phase. Its input bandwidth can be as high as the bandwidth of an operational amplifier of unity gain, thus ranging from kHz to GHz. Its rail-to-rail configuration allows it to have a very high conversion gain a and a very high input signal dynamic ranging from a few mV to about Vdd/2. Indeed, the conversion gain α is always very close to unity whatever the level of the input signals IN1, IN2, and the maximum amplitude of the input signals IN1, IN2 is very close to Vdd/2 with a constant conversion gain α.

With respect to the fully differential low-voltage self-calibrated CMOS peak detector circuit 200, other embodiments of a peak detector circuit can be implemented with other types of transistor technology, such as BiCMOS or bipolar technology.

Applications contemplated for such a present invention includes any integrated circuit wherein a peak detection is needed, and in particular Radio Frequency (RF) transceivers wherein accurate detection of low and high Take-Over-Point (TOP) levels is required. For example, in low-voltage wideband CMOS circuits with high input dynamic range using gain steps, the low gain of CMOS transistors, especially for low power circuits, involve low TOP levels that the present invention can accurately detect.

In summary, a low-voltage self-calibrated peak detector 100 has been described. Using a two-step calibration process that compensates the offset errors introduced by the respective first, second and third comparators 122, 128, 130, the peak detection is made accurate whatever temperature, process or mismatch spreads. Its input bandwidth can be as high as the bandwidth of an operational amplifier of unity gain. In a rail-to-rail configuration, it can implemented into a fully differential low-voltage self-calibrated CMOS peak detector 200, which can have a very high conversion gain α and a very high input signal dynamic ranging.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single or other unit may fulfil the functions of several items recited in the claims. The mere fact that certain measures are recited in mutually different dependent claims does not indicate that a combination of these measured cannot be used to advantage.

The computer program may be stored/distributed on a suitable medium, such as an optical storage medium or a solid-state medium supplied together with or as part of other hardware, but may also be distributed in other forms, such as via the Internet or other wired or wireless telecommunication systems. Furthermore, it may be any integrated state machine, field-programmable gate array (FPGA), or synthesized state machine from a register transfer level (RTL) design such as VHDL or Verilog™ programming languages.

Finally, any reference signs in the claims should not be construed as limiting the scope.

The invention claimed is:

1. A circuit arrangement comprising:
    a first comparator with a first input terminal and a second input terminal, said first comparator having a first input offset voltage when said first and second input terminals are short-circuited;
    a second comparator with a third input terminal and a fourth input terminal, said second comparator having a second input offset voltage when said third and fourth input terminals are short-circuited; and
    a third comparator with a fifth input terminal and a sixth input terminal, said third comparator having a third input offset voltage when said fifth and sixth input terminals are short-circuited;
    wherein,
        said third comparator is configured in a first phase to compensate said first and second input offset voltages and minimize the offset errors generated by said third input offset voltage; and
        said second comparator is configured in a second phase to compensate said first input offset voltage based on said first phase, said second phase being subsequent to said first phase; and
        each one of said first, second and third comparators has its output coupled together to a high impedance node.

2. The circuit arrangement according to claim 1, wherein, during said first phase,
    said first comparator is configured to operate in open-loop fashion and has said first and second input terminals short-circuited and supplied by a reference voltage;
    said second comparator is configured to operate in open-loop fashion and has said third and fourth input terminals short-circuited and supplied by said reference voltage;
    said third comparator is configured to operate in closed-loop fashion and compare said fifth input terminal supplied by said reference voltage to said sixth input terminal coupled to said high impedance node.

3. The circuit arrangement according to claim 2, wherein the comparison result of said third comparator is stored in a first memory element when a first voltage value of said sixth input terminal reaches said reference voltage of said fifth input terminal.

4. The circuit arrangement according to claim 3, wherein, during said second phase,
    said first comparator is configured to operate in open-loop fashion and has said first and second input terminals short-circuited and supplied by said reference voltage;
    said second comparator is configured to operate in closed-loop fashion and compare said fourth input terminal supplied by said reference voltage to said input terminal supplied by a supply voltage through a switching element;
    said third comparator is configured to operate in open-loop fashion and compare said fifth input terminal supplied by said reference voltage to said sixth input terminal supplied by said first voltage value.

5. The circuit arrangement according to claim 4, wherein the comparison result of said second comparator is stored in a second memory element when a second voltage value of said fourth input terminal reaches said reference voltage of said third input terminal.

6. The circuit arrangement according to claim 5, wherein, during a third phase,
    said first comparator is configured to operate in open-loop fashion and compare said first input terminal supplied by said reference voltage to said second input terminal supplied by an output voltage of said circuit arrangement, said output voltage being equal or close to said second voltage value;
    said second comparator is configured to operate in open-loop fashion and compare said fourth input terminal supplied by said reference voltage to said input terminal supplied by said second voltage value;
    said third comparator is configured to operate in open-loop fashion and compare said fifth input terminal supplied by said reference voltage to said sixth input terminal supplied by said first voltage value.

7. The circuit arrangement according to claim 4, wherein said switching element is a gate-controlled switching device driven by said high impedance node.

8. The circuit arrangement according to claim 1, wherein said first input terminal is further supplied by a time-varying input voltage.

9. A system comprising said circuit arrangement according claim 1, said circuit arrangement being implemented such that said system eis a fully differential system in a rail-to-rail configuration.

10. A method of calibrating said circuit arrangement according to claim 1, said method comprising the steps of:
    compensating said first and second input offset voltages during said first phase;
    minimizing the offset errors generated by said third input offset voltage during said first phase; and compensating said first input offset voltage during said second phase based on said first phase, said second phase being subsequent to said first phase.

11. The method according to claim 10, wherein said first phase further comprises the steps of:
- operating in open-loop fashion for said first and second comparators;
- supplying said first and second input terminals of said first comparator and said third and fourth input terminals of said second comparator with said reference voltage;
- operating in closed-loop fashion for said third comparator;
- comparing said fifth input terminal supplied by said reference voltage to said sixth input terminal coupled to said high impedance node; and
- storing the comparison result of said third comparator in said first memory element when said first voltage value of said sixth input terminal reaches said reference voltage of said fifth input terminal.

12. The method according to claim 11, wherein said second phase further comprises the steps of:
- operating in open-loop fashion for said first and third comparators;
- supplying said first and second input terminals of said first comparator with said reference voltage;
- operating in closed-loop fashion for said second comparator;
- comparing said fourth input terminal supplied by said reference voltage to said input terminal supplied by said supply voltage through said switching element;
- comparing said fifth input terminal supplied by said reference voltage to said sixth input terminal supplied by said first voltage value; and
- storing the comparison result of said second comparator in said second memory element when said second voltage value of said fourth input terminal reaches said reference voltage of said third input terminal.

13. The method according to claim 12, wherein said third phase further comprises the steps of:
- operating in open-loop fashion for said first, second and third comparators;
- comparing said first input terminal supplied by said reference voltage to said second input terminal supplied by said output voltage of said circuit arrangement, said output voltage being equal or close to said second voltage value;
- comparing said fourth input terminal supplied by said reference voltage to said input terminal supplied by said second voltage value;
- comparing said fifth input terminal supplied by said reference voltage to said sixth input terminal supplied by said first voltage value.

14. Computer program comprising program code for causing a computer to carry out the steps of the method as claimed in claim 10 when said computer program is carried out on a computer.

15. An integrated circuit comprising a system as claimed in claim 9.

* * * * *